United States Patent
Suzuki

[11] Patent Number: 5,897,377
[45] Date of Patent: Apr. 27, 1999

[54] SEMICONDUCTOR DEVICE MANUFACTURING METHOD WITH USE OF GAS INCLUDING ACYL-GROUP-CONTAINING COMPOUND

[75] Inventor: Kouji Suzuki, Haga-gun, Japan

[73] Assignee: Kawasaki Steel Corporation, Kobe, Japan

[21] Appl. No.: 08/934,759

[22] Filed: Sep. 22, 1997

[30]    Foreign Application Priority Data

Sep. 24, 1996  [JP]   Japan ..................................... 8-251433

[51] Int. Cl.⁶ ....................................................... C23F 1/00
[52] U.S. Cl. .............................. 438/706; 252/79; 252/153
[58] Field of Search .......................... 252/79, 79.1, 79.2, 252/79.4; 438/706, 710

[56]                References Cited

U.S. PATENT DOCUMENTS

| | | | |
|---|---|---|---|
| 4,215,005 | 7/1980 | Vander Mey | 252/153 |
| 4,732,837 | 3/1988 | Plotvin et al. | 430/192 |
| 5,158,854 | 10/1992 | Imamura et al. | 430/192 |

FOREIGN PATENT DOCUMENTS

| | | |
|---|---|---|
| 58-150429 | 9/1983 | Japan . |
| 5-102093 | 4/1993 | Japan . |
| 9-45662 | 2/1997 | Japan . |

*Primary Examiner*—Benjamin Utech
*Assistant Examiner*—Lynette T. Umez-Eronini
*Attorney, Agent, or Firm*—Oliff & Berridge, PLC

[57]                ABSTRACT

A semiconductor device manufacturing method includes an etching process or a surface-treating process in which an etching gas or a surface-treating gas including an acyl-group-containing compound represented by the following formula (1):

$$RCOX \qquad (1)$$

is used to form a sturdy film on the etched or treated surface, and high anti-resist selectivity, high anti-base-layer selectivity and high plasma-tolerance are thereby achieved, wherein R is an aliphatic hydrocarbon group, an aromatic hydrocarbon group, or a derivative thereof, and X is a substituent. Preferably, the substituent X in the above formula (1) is a halogen atom or a group represented by the following formula (2):

$$R'COO— \qquad (2)$$

wherein R' is an aliphatic hydrocarbon group, an aromatic hydrocarbon group, or a derivative thereof.

19 Claims, 4 Drawing Sheets

SEMICONDUCTOR DEVICE MANUFACTURING METHOD WITH USE OF GAS INCLUDING ACYL-GROUP-CONTAINING COMPOUND

BACKGROUND OF THE INVENTION

1. Field of Invention

The present invention relates to methods for manufacturing semiconductor devices, and more particularly, relates to a semiconductor device manufacturing method including an etching process or a surface-treating process which exhibits high etching selectivity for the subject layer being etched as against the resist film (layer) and the base layer while achieving a high tolerance to plasma (plasma tolerance).

2. Description of Related Art

Nowadays, the manufacture of semiconductor devices in increasingly higher degrees of integration requires an etching process capable of forming highly accurate fine patterns with a high etching selectivity.

For forming highly accurate patterns in semiconductor devices, an important factor is the accuracy in forming a mask in a photolithographic process which is performed using a photoengraving technique prior to the etching process. In such a photolithographic process, since the focal depth will necessarily be shallower for a finer pattern, a thinner resist film should essentially be formed. The thickness of such a resist film, however, cannot be uniformly predetermined, since the resist film is also etched to some extent and the thickness of the resist film is reduced in the etching process, and more specifically, the etching reaction proceeds while the etched ingredients from the resist film adhere to the side walls that form in the etched portions of the layer subject to etching. As a result, the shape of the etched patterns can be maintained. When the initial thickness of the resist film is close to the thickness reduced by etching, the resist film ingredients adhering to the side walls disappear, and the edges of the etched portions are etched to be round, namely, pattern breakdown occurs. Since the protection of such side walls is more significant for finer patterns, the thickness of the resist film is on a trade-off relationship between the accuracy in the photolithographic process and the pattern-shape maintenance in the etching process. In other words, success in highly accurate processing depends on the degree of improvement in the etching selectivity for the subject layer as against the resist film (anti-resist selectivity).

Further, in the etching process, the achievement of a high selectivity for the subject layer against the base layer (anti-base-layer selectivity) is essential in order to enhance the performance and reliability of the manufactured semiconductor device. For example, in gate etching, a high selectivity for the subject layer against a gate oxide film should be secured. Similarly, in contact-hole etching, the selectivity for the subject layer should be high against, for example, Si in a substrate, a silicide layer, and a silicon nitride stopper layer comprising $Si_3N_4$, $SiN_x$ or the like formed as a gate side wall or formed on a gate or a side wall in a self-alignment contact process. Further, in via-hole etching, such a selectivity should be high against an underlying metal such as TiN or $Ti_2N$ of an antireflection film.

In addition, in the etching process, vertical etching is not always most desirable. For example, a wiring pattern should preferably be etched in a normal taper manner in order to improve the coverage of an interlayer insulating film, and also, a contact-hole or via-hole should be etched in a normal taper manner in order to improve the coverage of a metallic wiring pattern in the hole.

Hitherto, investigations have been made on the main etching gas or additional gas in order to achieve high anti-resist and anti-base-layer selectivity, and to control the degree of taper in the etched pattern shape. For satisfying the above-described requirements concerning etching, for example, in an oxide-film etching process using a C-F-based gas such as $CF_4$ or $C_3F_8$, the C/F ratio should be preferably raised. Since F serving as a main etchant is capable of etching even the base layer, the base layer should preferably be covered with a protective film after the etch-off for the film which should be etched. By raising the C/F ratio, a number of $CF_2$ radicals and CF radicals, which can be precursors for a polymer film, can be generated in the plasma, and a fluorocarbon protective film can be thereby readily formed on the base layer surface. For this reason, in oxide-film etching, straight-chain fluorocarbons having a large number of carbon atoms such as $C_2F_6$ and $C_3F_8$, or unsaturated fluorocarbons such as $C_4F_8$ have been used as a main etching gas having a C/F ratio higher than $CF_4$. Meanwhile, the object of the addition of an additional gas is to scavenge excessive F in the plasma and to thereby raise the C/F ratio in the plasma. In this view, hydrogen-containing gases such as $H_2$, $CHF_3$, $CH_2F_2$ and $CH_3F$, CO, and others have been used as an additional gas.

Conventional etching processes for manufacturing semiconductor devices, in which $CF_2$ radicals and/or CF radicals are generated, are allowed to adhere and are polymerized, however, have some problems as follows.

First of all, it is difficult to decompose a $C_xF_y$ gas to efficiently obtain $CF_2$ radicals and/or CF radicals. Etching is performed in various manners of various discharging types, such as RIE (Reactive Ion Etching), MERIE (Magnetron Enhanced Reactive Ion Etching), ECR (Electron Cyclotron Resonance) etching and helicon wave etching, and the plasma electron energy level in one discharging type is different from that in another type. Meanwhile, a compound molecule has a specific dissociation energy. Accordingly, the etchant gas must be selected in accordance with the type of the etching system.

Further, although a gas system composed only by considering generation and polymerization of $CF_2$ radicals and/or CF radicals may satisfy the requirements concerning the etching selectivity, it is actually accompanied by problems such as a lowered etching rate, difficulty in removal of the resist film after etching, and an increased contact resistance due to carbon implantation into the base layer in a hole-forming process. For example, when a gas having a high C/F ratio is used, the etching rate is reduced due to the generation of a polymer film on the etched surface. If the discharging power is increased in order to compensate for such reduction, dissociation of $CF_2$ radicals and/or CF radicals further progresses to increase fluorine atoms. As a result, although the etching rate can be raised, the anti-base-layer selectivity is sacrificed. Accordingly, a high anti-resist or anti-base-layer selectivity, and high level requirements on other properties can rarely be achieved or satisfied at the same time by using such a conventional gas system composed only by considering generation and polymerization of $CF_2$ and/or CF radicals.

Secondly, a sufficient etching selectivity can rarely be achieved according to polymerization of $CF_2$ radicals and/or CF radicals due to their slow polymerization rate and the low tolerance of the resulting polymer film against plasma.

In conventional $CF_2$- and CF-radical polymerization, each $CF_2$ or CF radical is successively bonded with one another on the layer surface. Accordingly, a long time period is required until the layer surface is covered with the resulting polymer film, and in the meantime, the etching reaction further proceeds to etch the non-covered portions of the base layer. Further, such a slow polymerization rate includes a slow polymerization rate in the direction of the polymer film thickness. Accordingly, even if the base layer surface is once covered with the resulting polymer film, the polymer film will be immediately broken since the polymer film does not yet have a thickness tolerable to ion impact.

Further, since the polymer film is basically free of intramolecular polarity and the bonding strength between polymer molecules consists only of the intermolecular force, a high plasma tolerance can be enhanced only by thickening the polymer film. In summary, a sufficient etching selectivity cannot be achieved due to the slow polymerization rate and the low plasma tolerance of the polymer film.

Moreover, polymerization of $CF_2$ radicals and/or CF radicals adhering to the layer surface requires an energy supplementation by ion impact. The energy level required for such supplementation is, however, lower than that of the bias voltage required for improvement of the etching rate. Due to this, if the bias voltage is raised in order to improve the etching rate, $CF_2$ radicals, CF radicals and a polymer film thereof leave the layer surface due to excessive ion impact.

Furthermore, during the etching process, the fluorocarbon in the original etchant gas, in which the number of carbon atoms is large for achieving a higher C/F ratio, is decomposed into molecules having small numbers of carbon atoms in order to obtain $CF_2$ radicals and CF radicals. As a result, thus-generated carbon-containing ions having small molecular weights may be directly implanted into the base layer from the surface, or $CF_2$ radicals and CF radicals adhering to the layer surface before being polymerized may indirectly be implanted into the base layer by ion impact added from above. Particularly in contact-hole etching, a carbon-implanted layer formed according to such a mechanism can be a cause of high electric resistance. Although such a carbon-implanted layer has been conventionally removed in a post-treatment such as chemical dry etching (CDE), carbon implantation should be restricted to a level as low as possible in the main etching step since the depth of a junction in a future semiconductor device will be reduced to a level below the range controllable by CDE. Additionally, in a via-hole, the electric resistance increases in response to an increase in the amount of carbon implanted into an underlying metal such as TiN of an antireflection film, and which is also a problem with the conventional etching process in which $CF_2$ radicals and CF radicals are generated, allowed to adhere, and polymerized.

Thirdly, conventional gas systems cause some problems concerning stability in apparatus operation.

As described above, a $C_xF_y$ polymer film formed according to the polymerization of $CF_2$ radicals and/or CF radicals is basically free of intramolecular polarity, and the bonding strength between polymer molecules consists only of the intermolecular force. Accordingly, during a continuous operation, when such radicals adhere to the inner surface of a processing chamber to form a fluorocarbon film and the film then accumulates to some extent, the film starts peeling off from the surface due to the stress of the film itself or the stress induced by the heat cycle generated by a discharge cycle, and then scatters particles. Such particles generate pattern deficiencies in the semiconductor devices, and readily lower the yield of the products.

Further, since an electrostatic chuck is mainly employed as a wafer-holding mechanism in an etching apparatus because of its ability to achieve high uniformity in a wafer surface, foreign substances such as particles peeled from the chamber wall that enter between the wafer-holding stage of an etching apparatus and a wafer may damage the stage surface by causing abnormal discharge at the back surface of the wafer when a voltage for holding the wafer is applied.

In the case where a conventional gas system is used, chamber cleaning must be frequently performed for the prevention of the above-described problems, which results in a lowered capacity of the apparatus.

Fourthly, the case where a certain gas is used, and more specifically CO is used, is accompanied by some problems.

A so-called self-alignment contact technique is employed for achieving high degrees of integration of semiconductor devices, in which a stopper layer such as a SiN layer is provided on a gate or a side wall, and the contact-opening size at the time of a contact-photolithography can thereby be large and the contact can extend to the gate. In such a self-alignment contact technique, a $C_4F_8$/CO gas mixture is typically used since it achieves a high selectivity for the etching subject (the material to be etched) against SiN. In factories, however, since CO is fed from a storage facility through a central supplying system, the use of CO requires a fairly large amount of labors and costs for safety management.

SUMMARY OF THE INVENTION

The present invention has been accomplished considering the above-described problems inherent in the prior art. Accordingly, the object of the present invention is to provide a semiconductor device manufacturing method including an etching process or a surface-treating process in which an etching gas or a surface-treating gas including an acyl-group-containing compound is used to form a sturdy film on the etched or treated surface, and high anti-resist selectivity, high anti-base-layer selectivity and high plasma-tolerance are thereby achieved.

In order to achieve the above-described object, according to the present invention, there is provided a semiconductor device manufacturing method characterized by using an etching gas or a surface-treating gas which includes an acyl-group-containing compound represented by the following formula (1):

RCOX     (1)

wherein R is an aliphatic hydrocarbon group, an aromatic hydrocarbon group, or a derivative thereof, and X is a substituent.

Preferably, the substituent X in the above formula (1) is a halogen atom or a group represented by the following formula (2):

R'COO—     (2)

wherein R' is an aliphatic hydrocarbon group, an aromatic hydrocarbon group, or a derivative thereof.

Further, R in the above formula (1) should preferably be an aliphatic hydrocarbon group, an aromatic hydrocarbon group, or a derivative thereof in which the number of carbon atoms is 10 or less.

Similarly, R' in the above formula (2) should preferably be an aliphatic hydrocarbon group, an aromatic hydrocarbon group, or a derivative thereof in which the number of carbon atoms is 10 or less.

Moreover, the present invention provides a semiconductor device manufacturing method using such an acyl-groupcontaining compound together with a gas comprising a hydrogen-containing compound.

Furthermore, the present invention provides a semiconductor device manufacturing method using such an acyl-group-containing compound together with a gas comprising a nitrogen-containing compound capable of forming an amide in an etching reaction system.

Incidentally, the content of such an acyl-group-containing compound in an etching gas or a surface-treating gas should preferably be 0.2 to 20%.

DETAILED DESCRIPTION OF PREFERRED EMBODIMENTS

The semiconductor device manufacturing method according to the present invention is further illustrated in detail below.

As described above, the semiconductor device manufacturing method according to the present invention is characterized by including an etching process or a surface-treating process in which an etching gas or a surface-treating gas comprising a compound represented by the above-described formula (1) containing an acyl (RCO) group (hereinafter referred to as acyl compound) is used to form a highly plasma-tolerant and sturdy film on the etched or treated surface.

In an acyl compound, the carbonyl carbon atom is bonded to three atoms with an sp2 orbital. The remaining p orbital forms the $\pi$ bond between the carbon atom and the oxygen atom. Since oxygen has high electronegativity, the oxygen atom attracts electrons so that it possesses a negative charge and the carbonyl carbon atom readily possesses a positive charge. In addition, since the carbonyl carbon atom and the other three atoms bonded thereto are aligned on one plane, namely, there is no steric hindrance, the acyl compound is easily affected by nucleophilic substitution. Especially, in acid chloride derivatives, an extremely weak base ($Cl^-$) is bonded to the carbonyl carbon atom, and an elimination reaction readily occurs.

When the etching reaction progresses to cause over-etching, in the case of which the anti-base-layer selectivity is significant, the etchant tends to be excessive due to the consumption of the etching subject. As a result, the resist film is progressively etched, and the fluorocarbon-based etched ingredients from the resist film and polymer substances from the vapor phase form a thin deposition on the base layer surface. Since the surface of the deposition receives ultraviolet rays and ion impact derived from discharging, the compounds in the deposition may be caused to cleave to form radicals, or may generate unshared electron pairs due to elimination of atoms.

When an acyl compound is diffused on such a surface of a deposition, the carbonyl carbon atoms having positive charges form linkages with unshared electron pairs on the surface, and a polymer film is formed.

Alternatively, when an acyl compound is transformed into radicals in plasma, the radicals form linkages with radicals on the wafer surface, and a polymer film is also formed, wherein acyl groups have been introduced into the polymer film.

In the above-described manner, the reaction of an acyl compound progresses in accordance with the progress of over-etching.

The reactivity of a carbonyl group is enhanced when $H^+$ is added to the carbonyl carbon atom. From this viewpoint, the addition of hydrogen or a hydrogen-containing gas is effective in promoting the above-described reaction of an acyl compound.

The acyl-compound polymerization in the manufacturing method according to the present invention is different from the conventional $CF_2$- and/or CF-radicals polymerization in the deposition rate and plasma tolerance. In the method according to the present invention, since the acyl compound originally contains hydrocarbon, one reaction can deposit carbon chains on the etched surface as many as a few times that before. Further, since the deposited polymer film includes the intramolecular carbonyl groups (C=O), the intermolecular bonds in the polymer film can be strengthened due to the polarity of the carbonyl groups, a high plasma tolerance can be achieved even if the polymer film is thin. As a result, the polymer film can possess a high strength and a thickness required to protect the base layer, and therefore, the anti-base-layer etching selectivity can be improved.

According to the manufacturing method of the present invention, since the resulting polymer film exhibits high strength, high plasma resistance can be achieved with a reduced polymer-film thickness as compared with the conventional method. Due to this, the deposition of such a polymer film onto the inner walls of the apparatus can also be restricted. Further, since the bond force is high in the deposited film, the film can be formed such that peeling does not readily occur. As a result, particle generation, which is a cause of defective semiconductor devices, can be inhibited, the intervals of apparatus cleaning can be prolonged, the apparatus capacity can be improved, and a reduction in the product yield can be prevented.

Further, when an acyl compound is used with the addition of $NH_3$, an amide is formed. Since strong hydrogen bonds are formed between amide molecules, a high plasma tolerance, namely, a high anti-base-layer selectivity can be achieved by the addition of $NH_3$ even if a further thinner polymer film should be formed. From this viewpoint, in the present invention, an acyl compound should preferably be used together with a gas which contains nitrogen atoms in the form of $NH_3$ or the like, and which is capable of forming an amide in the reaction system for etching.

As described above, the manufacturing method of the present invention is effective in improving the anti-base-layer etching selectivity and preventing particle generation in the apparatus, though the effects of the method are not limited thereto.

When exposed to plasma, the surfaces of the resist film and side walls of the etched portions also have radicals as a result of link cleavage and unshared electron base pairs as a result of atom elimination. Sturdy polymer films can be formed in such sites according to the reaction with an acyl compound. Such reaction with an acyl compound can be uniformly caused even in the aforementioned side-wall portions by diffusing the main etching gas together with an additional gas containing an acyl compound from the vapor phase. The effect of such a manner of diffusing is significant. Since sturdy polymer films can be easily formed on the side walls of etched portions, the side walls do not need to be covered with the resist ingredients derived from the resist edges shaved by ion impact in an manner of sputtering which is performed in the conventional method. In other words, etching or surface-treating properties equal to those of the conventional method can be achieved with a lower ionic energy. As a result, disappearance or consumption of the resist film can be prevented, and by lowering the ionic energy, damage to the semiconductor devices can be reduced. For example, in a contact hole or a via hole, the electric resistance can be lowered since carbon implantation can be restricted by the reduction of the ionic energy. Further, in gate etching, since excessive electric-charge inflow can be restricted, aberration in the obtained patterns and breakdown in the gate insulating film due to charge-up can also be prevented.

As a matter of course, a sturdy film is formed on the resist surface, and the influence of ionic energy (ion impact) on the resist film can be lowered by the film. Due to such a synergistic effect, even a thinner resist film is available for etching, and the photolithographic process can be performed with a markedly improved fineness and accuracy.

In the aspect of the facility, since almost all acyl compounds are liquid at ambient temperatures, they can be fed into a process chamber from a liquid container while heating. Accordingly, an apparatus for feeding an acyl compound can be locally placed close to the etching or surface-treating apparatus. As a result, the facility can be safely operated, and the costs of the facility establishment, safety management and maintenance can be restricted.

In the manufacturing method of the present invention, an acyl compound represented by the above-described formula (1) is contained in an etching gas.

The group R in the formula (1) is an aliphatic hydrocarbon group, an aromatic hydrocarbon group, or a derivative thereof, and preferably, the number of carbon atoms in the group R should be 10 or less. When the number of carbon atoms exceeds 10, the boiling point of the acyl compound becomes high. Accordingly, it will be difficult to feed the compound to the etching process in the form of a gas, and the compound may be thermally decomposed when heated to a high temperature for gasification.

Meanwhile, the group X in the above-described formula (1) should preferably be a halogen atom such as fluorine, chlorine, bromine, or iodine, or a substituent represented by the above-described formula (2). When X is such an atom or a substituent, desirable elimination or substitution reactions readily occur in the acyl compound.

In the above-described formula (2), the group R' is an aliphatic hydrocarbon group, an aromatic hydrocarbon group, or a derivative thereof, and preferably, the number of carbon atoms in the group R' should be 10 or less. When the number of carbon atoms exceeds 10, the boiling point of the acyl compound becomes high. Accordingly, it will be difficult to feed the compound to the etching process in the form of a gas, and the compound may be thermally decomposed when heated to a high temperature for gasification. Although almost all acyl compounds are liquid at ambient temperatures, the acyl compounds preferred in the present invention are liquid at ambient temperatures but are gasified at temperatures within the range from an ambient temperature to 100° C.

Typical examples of acyl compounds used in the manufacturing method of the present invention include: acid chlorides such as acetyl chloride, propyonyl chloride, n-butyryl chloride, n-valeryl chloride, benzoyl chloride and p-nitrobenzoyl chloride; acid bromides such as acetyl bromide and benzoyl bromide; acid iodides such as acetyl iodide and benzoyl iodide; acid fluorides such as acetyl fluoride; and acid anhydrides such as acetic anhydride and benzoic anhydride. Among these, acetyl bromide and benzoyl bromide are especially preferred. Each of the above-listed compounds can be used solely or in combination with one or more others.

Such an acyl compound may be fed into the etching process as an additional gas together with a main etching gas. Ordinarily-used C-F-based gases such as $CF_4$, $C_2F_6$, $C_3F_8$ and $C_4F_8$ can be used as a main gas. Further, the main gas may also contain a carrier gas such as a rare gas in addition to an etchant.

Preferably, the acyl compound should be fed at a flow rate which achieves a content in the etching gas of 0.2 to 20%. With a content above 20%, polymer deposition will be excessive. On the other hand, with a content below 0.2%, a polymer film derived from the acyl compound will not be sufficiently formed on the etched surface. Here, the term "content" means the percentage of the acyl compound flow rate in the total gas flow rate for the etching process, namely, it can be expressed by [(Acyl Compound Flow Rate/Total Gas Flow Rate)×100].

The acyl compound may be fed during the entire etching process, or during a part of the etching process. Alternatively, the acyl compound may be brought into contact with patterned wafers for a surface treatment of the wafers during the period from the end of the photolithographic process to the time when the wafers enter the etching chamber.

The reaction of forming an acyl-compound-based polymer film can be enhanced by the addition of $H^+$ to the carbonyl carbon of the acyl group. From this viewpoint, the acyl compound should preferably be used together with a gas comprising a hydrogen-containing compound. Examples of hydrogen-containing compounds include hydrogen, $CHF_3$, $CH_2F_2$, and $CH_3F$. The gas comprising a hydrogen-containing compound should preferably be fed at a flow rate of 50 to 200% relative to that of the acyl compound.

Further, in the manufacturing method of the present invention, the acyl compound should preferably be used together with a gas comprising a nitrogen-containing compound capable of forming an amide in the etching reaction system. An acyl compound with the addition of a gas comprising a nitrogen-containing compound such as $N_2$ and $NH_3$ forms an amide capable of forming strong intermolecular hydrogen bonds. Accordingly, the acyl-compound-based polymer film formed with the addition of a nitrogen-containing gas exhibits high plasma tolerance, namely, achieves high etching selectivity at a reduced thickness. Such a gas comprising a nitrogen-containing compound capable of forming an amide in the etching reaction system (hereinafter referred to as amide-forming gas) may comprise a compound such as $NH_3$, primary amines, secondary amines, tertiary amines, and $N_2$. Typical examples of primary amines, secondary amines and tertiary amines include methylamine, dimethylamine, ethylamine, diethylamine, triethylamine, n-propylamine, and di-n-propylamine. Each of the above-listed compounds can be used solely or in combination with one or more others. The amide-forming gas should preferably be fed at a flow rate of 60% or below, and more preferably 40% or less, relative to that of the acyl compound.

In addition to $N_2$, $NH_3$, or the like, the amide-forming gas may further contain a rare gas such as Ar or He which has low reactivity with such a nitrogen-containing compound.

Since almost all acyl compounds are liquid at ambient temperatures, the acyl compound used in the manufacturing method of the present invention can be fed to a process chamber from a liquid container through heating and gasification by a heater or the like. In the case where the acyl compound is fed into an etching chamber, it may be fed as a mixture with the main etching gas and additional gases such as the aforementioned gas comprising a hydrogen-containing compound and the aforementioned amide-forming gas. Meanwhile, in the case where the acyl compound is fed during the period from the end of the photolithographic process to the time when the wafers enter the etching chamber, it may be fed as a mixture with the above-described additional gases.

Moreover, in the manufacturing method of the present invention, after the wafers are subjected to the etching process using an etching gas containing an acyl compound, the resist films can be removed using a plasma ashing system or the like, and then the wafers may be sent to the subsequent process.

The method of the present invention can be widely employed for manufacturing semiconductor devices without any special limitation so long as the manufacturing method includes an etching process. The etching process may be a metal etching process, a gate etching process, a contact-hole etching process, a via-hole etching process, a self-alignment contact etching process, an SOG etch-back process, or the like. Further, the subject for the etching process or surface-treating process in the manufacturing method of the present invention may be, for example, a single-crystalline, poly-crystalline or amorphous silicon, a silicon oxide, a silicon nitride, a metallic film, or the like.

The present invention will be further illustrated in detail with reference to the examples below.

EXAMPLE 1

Contact-Hole Etching Using Parallel-Plate-Type Ion Etching Apparatus

Etching processes with various $CH_3COBr$ contents were performed in order to examine the following properties with each $CH_3COBr$ content:

(1) Anti-resist selectivity and the tapered angle of the etched hole;

(2) $SiO_2$/Si selectivity and the contact resistance;

(3) The electric charge accumulated on the substrate surface; and (4) Particle generation.

The etching conditions were as follows.

A frequency of 380 kHz and an RF power of 700 to 900 W were employed, which could be split-applied to the upper and lower electrodes. For chamber evacuation, a turbo-molecular pump and a dry pump were used. As to the etching gas, the main gas comprised $CF_4$, $C_4F_8$ and Ar, and the additional gas comprised $CH_3COBr$ and $NH_3$. The flow rate of $NH_3$ was one third that of $CH_3COBr$. Each etching gas ingredient was fed into the etching chamber by a mass-flow controller at a desired flow rate shown in Table 1, and converted into plasma. The acyl compound was mixed into the etching gas through gasification by heating the liquid container with the acyl compound. The conditions of the etching gas during the etching process are shown in Table 1. Each of the subject wafers was held by an electrostatic chuck system on the lower electrode, and the space between the back surface of the wafer and the stage was filled with He. In this manner, a thermal conduction was secured between the wafer and the stage cooled by a chiller. The interlayer insulating film in the wafer was a borophosphosilicate glass ("BPSG") film with a thickness of 1 $\mu$m.

For comparison, an etching process without addition of $CH_3COBr$ and $NH_3$ was carried out ($CH_3COBr$ content=0), and the several properties described above were examined.

The $CH_3COBr$ content relative to the total etching gas was stepwisely varied from 1% to 5%, and the above-described several properties with each $CH_3COBr$ content were examined. The gas conditions for each $CH_3COBr$ content were adjusted as shown in Table 1. The parameters other than $CH_3COBr$ content were adjusted such that the same tapered angle of the etched hole as that in the case without addition of $CH_3COBr$ and $NH_3$ (comparative example) should be achieved in each case.

TABLE 1

|  | Comparative Example | Examples According to Invention | | | | |
| --- | --- | --- | --- | --- | --- | --- |
| $CH_3COBr$ Content (%) | 0 | 1 | 2 | 3 | 4 | 5 |
| Gas Flow Rate (sccm) | | | | | | |
| $CF_4 + C_4F_8$ + Ar | 600 | 592 | 584 | 576 | 568 | 560 |
| $CH_3COBr$ | 0 | 6 | 12 | 18 | 24 | 30 |
| $NH_3$ | 0 | 2 | 4 | 6 | 8 | 10 |
| Temperature (° C.) | -10 | -10 | -10 | -10 | -10 | -10 |
| Pressure (Torr) | 0.35 | 0.35 | 0.45 | 0.45 | 0.55 | 0.55 |

(1) Anti-Resist Selectivity and Tapered Angle of Etched Hole

Figure 1:
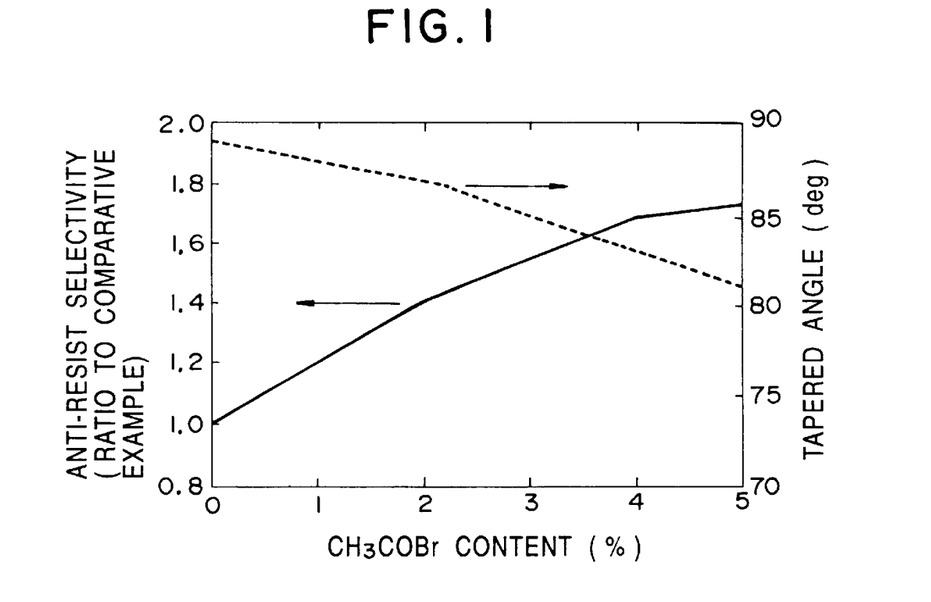
FIG. 1 is a graph showing the relationship between $CH_3COBr$ content and anti-resist selectivity, and the relationship between $CH_3COBr$ content and tapered angle of a V-shaped etched hole, as discussed in Example 1.

Measurements of anti-resist selectivity and tapered angle of a V-shaped etched hole were performed while the contents of $CH_3COBr$ and $NH_3$ mixed with $CF_4$, $C_4F_8$ and Ar were stepwisely increased. The results in view of the relationship with $CH_3COBr$ content are shown in FIG. 1. Incidentally, the term "$CH_3COBr$ content" means the percentage of the $CH_3COBr$ flow rate to the total gas flow rate.

As is obvious from FIG. 1, when the $CH_3COBr$ content was increased from 0% to 5%, the anti-resist selectivity was improved by nearly 80%, and the tapered angle was reduced from 89° to 81°.

(2) $SiO_2$/Si Selectivity and Contact Resistance

The tendency of changes in $SiO_2$/Si selectivity and the contact resistance relative to $CH_3COBr$ content was examined while the $CH_3COBr$ content was stepwisely increased and the other parameters were adjusted such that the same tapered angle as that in the case without addition of $CH_3COBr$ and $NH_3$ should be obtained. The results are shown in FIG. 2.

Figure 2:
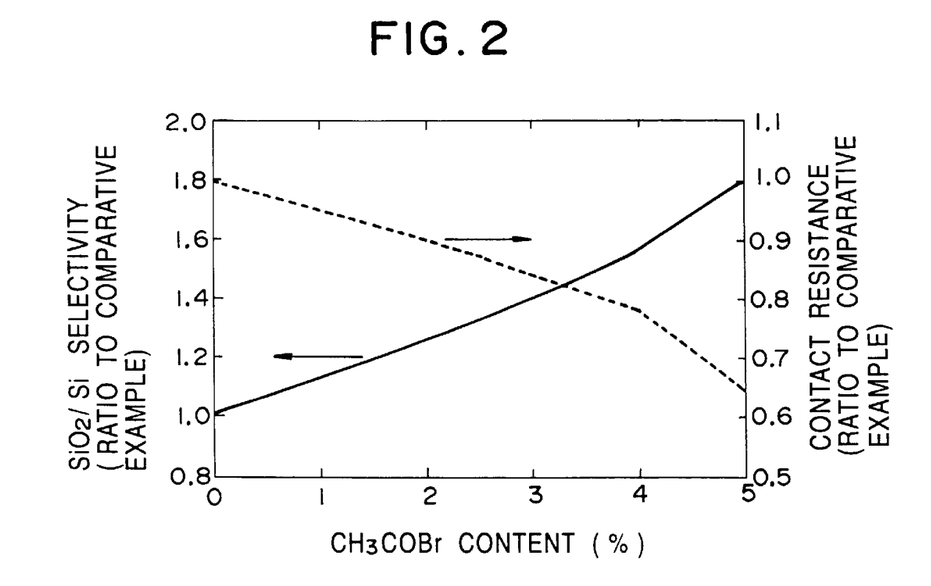
FIG. 2 is a graph showing the relationship between $CH_3COBr$ content and $SiO_2/Si$ selectivity, and the relationship between $CH_3COBr$ content and the contact resistance, as discussed in Example 1.

As is obvious from FIG. 2, when the $CH_3COBr$ content was increased, the $SiO_2/Si$ selectivity could be improved by nearly 80%, and the contact resistance could be reduced by 30% or more.

(3) Electric Charge Accumulated on Substrate Surface

Changes in the electric charge accumulated on the substrate surface as discussed in changes in $CH_3COBr$ content were observed using an $E^2PROM$ system while the parameters other than $CH_3COBr$ content were adjusted such that the same tapered angle as that in the case without addition of $CH_3COBr$ and $NH_3$ should be obtained. The results are shown in FIG. 3.

Figure 3:
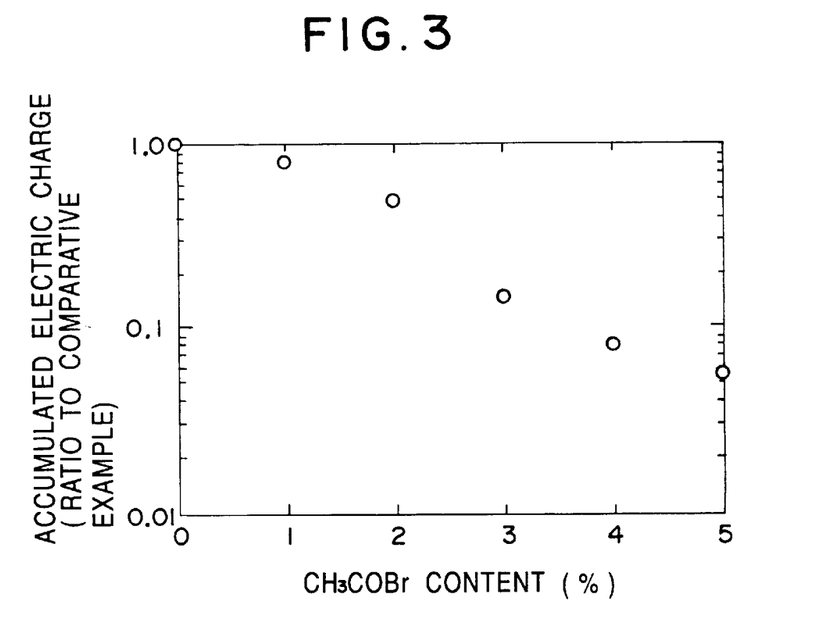
FIG. 3 is a graph showing the relationship between $CH_3COBr$ content and the amount of the electric charge accumulated on the substrate surface, as discussed in Example 1.

As is obvious from FIG. 3, when the $CH_3COBr$ content was increased while the other parameters were adjusted such that the same tapered angle as that in the case with a $CH_3COBr$ content of 0 should be obtained, the accumulated electric charge could be reduced to nearly one tenth.

(4) Particle Generation

Changes in the number of 0.3-$\mu$m or larger particles generated in the chamber during discharge for total 30 hours were observed as discussed in changes in $CH_3COBr$ content while the parameters other than $CH_3COBr$ content were adjusted such that the same tapered angle as that in the case without addition of $CH_3COBr$ and $NH_3$ should be obtained. The results are shown in FIG. 4.

Figure 4:
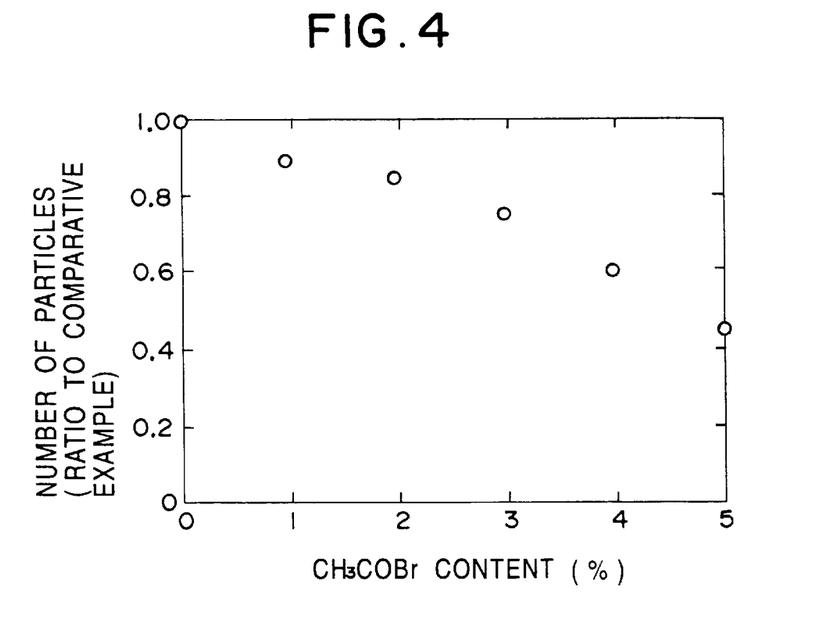
FIG. 4 is a graph showing the relationship between $CH_3COBr$ content and the number of 0.3-$\mu$m diameter or larger particles generated in the reaction chamber, as discussed in Example 1.

As is obvious from FIG. 4, when the $CH_3COBr$ content was increased while the other parameters were adjusted such that the same tapered angle as that in the case with a $CH_3COBr$ content of 0 should be obtained, the number of the generated particles could be reduced to nearly half.

According to the manufacturing method of the present invention, since an etching gas which contains an acyl compound is used, sturdy polymer films can be formed on the etched surface and the side walls of the etched portions. Due to this, the anti-resist and anti-base-layer selectivity can be enhanced.

Further, since such polymer films exhibit high plasma tolerance, the amount of a deposition gas, which is conventionally added to the main etching gas to maintain the shape of the film, can be reduced. As a result, the amount of carbon implanted into the substrate can be reduced and the contact resistance can be lowered. Moreover, the amount of substances adhering to the inner walls of the apparatus can also be reduced. Such adhering substances are thinner and more firmly attached to the walls of the apparatus than those generated by the conventional process. According to the present invention, therefore, a process which generates less dust can be achieved.

Furthermore, since enhancement of the side-wall-protecting effect by the addition of the acyl compound can relax the conventional requirements of low-pressure and high-ionic-energy conditions for anisotropic processing, the electric charge accumulated on the wafer during etching can be reduced.

EXAMPLE 2

Metal Etching Using ECR Etching Apparatus and Resist Film Mask

The following properties:

(1) the yield of metallic wiring patterns formed on an irregular surface; and (2) dependency of the resistance of wiring patterns on the interval between the wiring patterns, were measured or evaluated in the case of addition of approximately 5% of pyruvoyl chloride, $CH_3COCOCl$, to the etching gas, and in the case without addition of the same, respectively.

The etching conditions were as follows.

Figure 5:
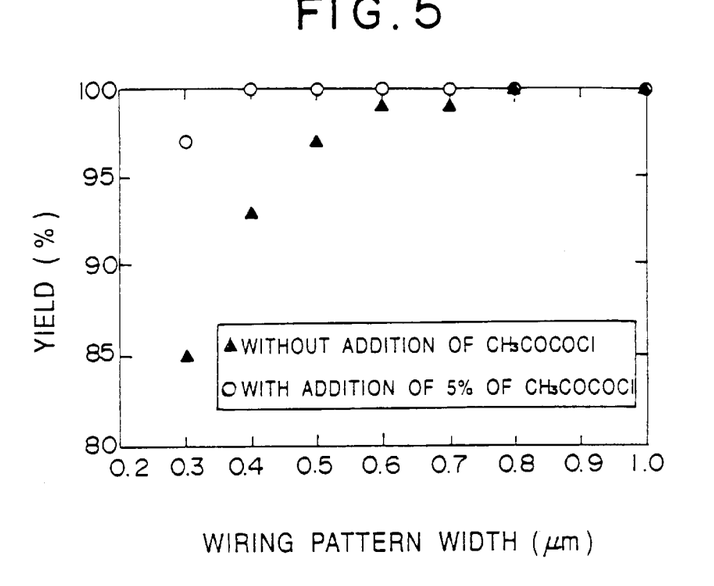
FIG. 5 is a graph showing the yields of metallic wiring patterns on a surface having 1 $\mu$m up-and-down irregularity with or without the addition of 5% of $CH_3COCOCl$ to the reaction system, as discussed in Example 2.
Figure 6:
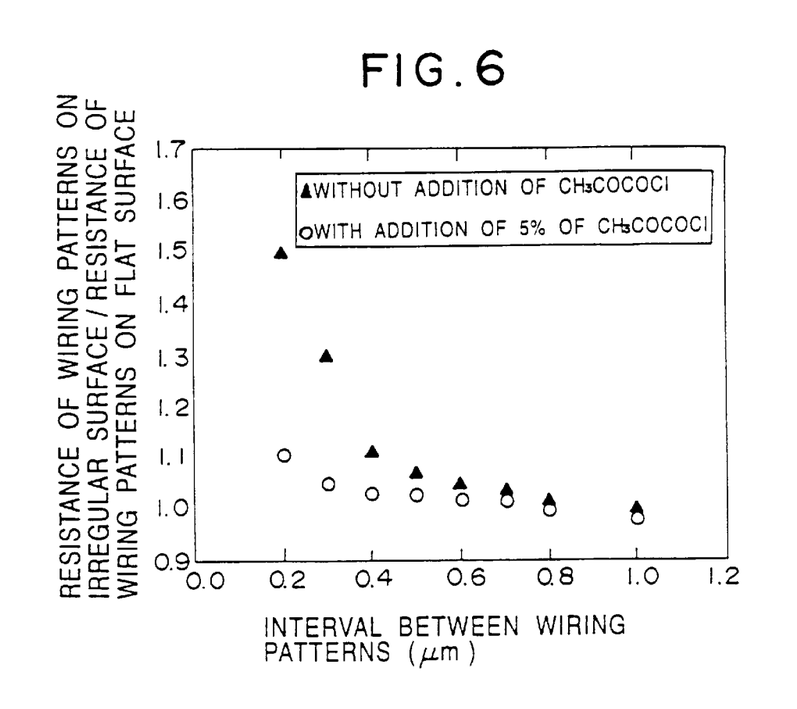
FIG. 6 is a graph showing the dependency of the resistance of metallic wiring on the wiring pattern interval when the wiring patterns are formed on a flat surface or a surface having 1 $\mu$m up-and-down irregularity with or without the addition of 5% of $CH_3COCOCl$ to the reaction system, as discussed in Example 2.

Under the application of a microwave power of 1,000 W and an RF power of 35 W, a main etching gas comprising $BCl_3$ and $Cl_2$ was fed into an etching chamber at a flow rate of 175 sccm together with an additional gas comprising $CH_2F_2$ and Ar at a flow rate of 150 sccm such that the pressure should be 1 Pa. In the case with the addition of pyruvoyl chloride, pyruvoyl chloride was heated to be gasified, and added at a flow rate of approximately 17 sccm. In each case with or without the addition of pyruvoyl chloride, metallic films which had a total thickness of approximately 1 $\mu$m and comprised the TiN/AlCu/TiN/Ti multilayer (with thicknesses of 0.1 $\mu$m/0.8 $\mu$m/0.1 $\mu$m/0.05 $\mu$m, respectively) were etched into wiring patterns of various widths on a flat surface and a surface having 1-$\mu$m up-and-down irregularity, respectively. After the completion of etching, each resultant was subjected to the removal of the resist film mask, the resistance of the wiring patterns was measured, and the yield of the wiring patterns was evaluated. The results are shown in FIG. 5. Incidentally, the wiring patterns with a resistance value below 10 k$\Omega$ were evaluated as unsatisfactory. Further, FIG. 6 shows changes in the ratio of the resistance of the wiring patterns formed on an irregular surface to the resistance of the wiring patterns formed on a flat surface as discussed in changes in the interval between the wiring patterns.

As is obvious from FIG. 5, the yield improved by 5% or more in the wiring patterns of 0.4-$\mu$m width or narrower when 5% of pyruvoyl chloride was added to the etching gas. Meanwhile, as is obvious from FIG. 6, the relative increase in the resistance of the wiring patterns formed on an irregular surface at narrower intervals, as compared to the wiring patterns on a flat surface, was smaller when 5% of pyruvoyl chloride was added to the etching gas.

When the metallic layer is coated with a resist film before metal etching, the resist film becomes thinner in the portions exhibiting larger surface-irregularity while it becomes thicker in the portions exhibiting smaller surface-irregularity. Accordingly, when the anti-resist selectivity is low, the edge (shoulder) of the resist film disappears and the metal is etched in the portions exhibiting large surface-irregularity, and therefore, the width of the resulting metallic wiring pattern becomes narrow. Consequently, the resistance of the wiring pattern is increased, and in an extreme case, cutoff may occur.

According to the manufacturing method of the present invention, since an etching gas which contains an acyl compound is used, and the etching selectivity for the metal against the resist film can thereby be improved, the yield of wiring patterns can be improved.

EXAMPLE 3

Metal Etching Using ECR Etching Apparatus and Film Mask

Figure 7:
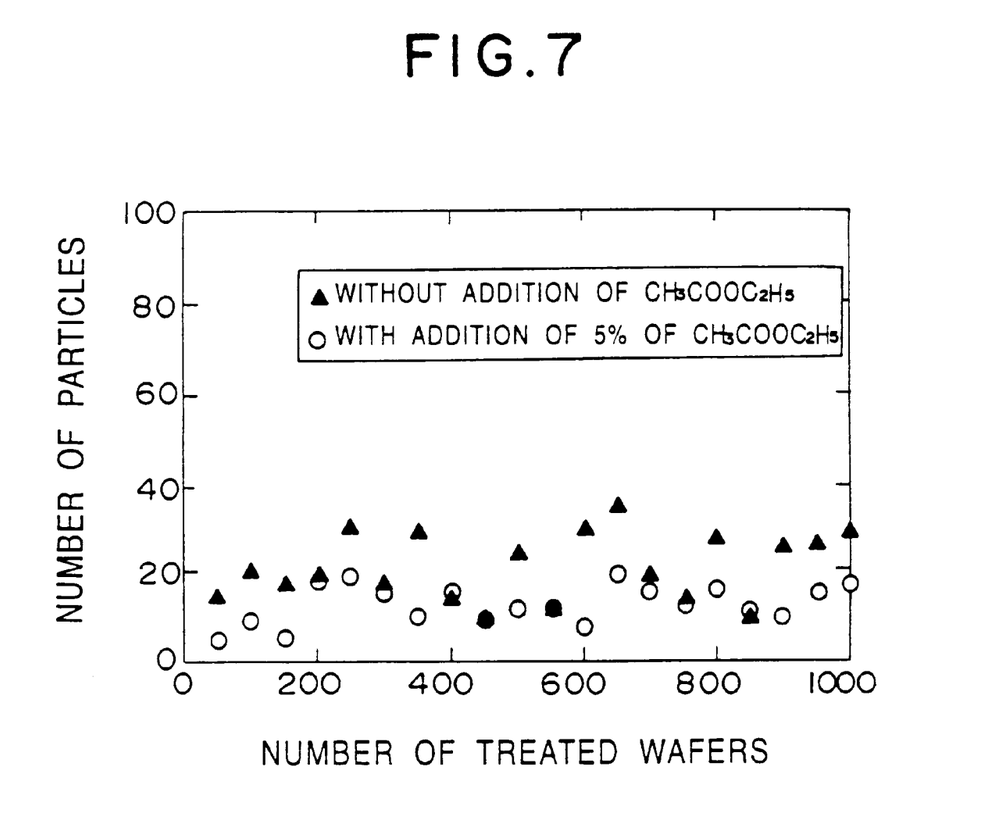
FIG. 7 is a graph showing changes in the number of particles generated in a system with or without the addition of $CH_3COOC_2H_5$, as discussed in Example 3.

Under the same etching conditions as those in Example 2 except that ethyl acetate, $CH_3COOC_2H_5$, and $NH_3$ were added instead of pyruvoyl chloride at flow rates of 12 sccm and 4 sccm (total 16 sccm), respectively. Changes in the number of 0.2-$\mu$m or larger particles per single wafer during continuous treatment of 1,000 wafers while performing plasma cleaning at a frequency of once per 25 wafers were observed and evaluated using a laser-scattering-type particle counter. Here, "plasma cleaning" was a process for cleaning the chamber in which discharging was performed while chlorine gas ($Cl_2$) and argon gas (Ar) were made to flow, then discharging was performed while oxygen ($O_2$) gas was made to flow, and metallic products adhering to the inside of the chamber were thereby removed. The results are shown in FIG. 7. Particle generation was markedly reduced in the case with the addition of ethyl acetate and $NH_3$ as compared with the case without addition of the same, as the average particle number in the former was 22 while that in the latter was 13. As is obvious from the results, according to the manufacturing method of the present invention, a process which generates less dust has been achieved by using an etching gas containing an acyl compound.

What is claimed is:

1. A semiconductor device manufacturing method comprising an etching process or a surface-treating process in which an etching gas or a surface-treating gas containing an acyl-group-containing compound represented by the formula RCOX is used, wherein R is an aliphatic hydrocarbon group, an aromatic hydrocarbon group or a derivative thereof, and X is a substituent other than the hydroxyl group —OH.

2. The semiconductor device manufacturing method according to claim 1, wherein a single-crystalline, polycrystalline or amorphous silicon, a silicon oxide, a silicon nitride, or a metallic film is subjected to said etching process or surface-treating process.

3. The semiconductor device manufacturing method according to claim 1, wherein R has 10 or less carbon atoms.

4. The semiconductor device manufacturing method according to claim 3, wherein said acyl-group-containing compound is used together with a gas comprising a hydrogen-containing compound.

5. The semiconductor device manufacturing method according to claim 3, wherein said acyl-group-containing compound is used together with a gas comprising a nitrogen-containing compound capable of forming an amide.

6. The semiconductor device manufacturing method according to claim 1, wherein said acyl-group-containing compound is used together with a gas comprising a hydrogen-containing compound.

7. The semiconductor device manufacturing method according to claim 1, wherein said acyl-group-containing compound is used together with a gas comprising a nitrogen-containing compound capable of forming an amide.

8. The semiconductor device manufacturing method according to claim 1, wherein the content of said acyl-group-containing compound is 0.2% to 20%.

9. The semiconductor device manufacturing method according to claim 3, wherein the content of said acyl-group-containing compound is 0.2% to 20%.

10. The semiconductor device manufacturing method according to claim 1, wherein X is a halogen atom or an organic group represented by the formula R'COO—, wherein R' is an aliphatic hydrocarbon group, an aromatic hydrocarbon group or a derivative thereof.

11. The semiconductor device manufacturing method according to claim 10, wherein a single-crystalline, polycrystalline or amorphous silicon, a silicon oxide, a silicon nitride, or a metallic film is subjected to said etching process or surface-treating process.

12. The semiconductor device manufacturing method according to claim 10, wherein R has 10 or less carbon atoms.

13. The semiconductor device manufacturing method according to claim 12, wherein said acyl-group-containing compound is used together with a gas comprising a hydrogen-containing compound.

14. The semiconductor device manufacturing method according to claim 12, wherein said acyl-group-containing compound is used together with a gas comprising a nitrogen-containing compound capable of forming an amide.

15. The semiconductor device manufacturing method according to claim 12, wherein the content of said acyl-group-containing compound is 0.2% to 20%.

16. The semiconductor device manufacturing method according to claim 12, wherein R' has 10 or less carbon atoms.

17. The semiconductor device manufacturing method according to claim 16, wherein said acyl-group-containing compound is used together with a gas comprising a hydrogen-containing compound.

18. The semiconductor device manufacturing method according to claim 16, wherein said acyl-group-containing compound is used together with a gas comprising a nitrogen-containing compound capable of forming an amide.

19. The semiconductor device manufacturing method according to claim 16, wherein the content of said acyl-group-containing compound is 0.2% to 20%.

* * * * *